United States Patent
Rother

[11] Patent Number: 6,118,278
[45] Date of Patent: Sep. 12, 2000

[54] SHORT CIRCUIT DETECTION IN PARTICULAR FOR A MEASURING BRIDGE

[75] Inventor: Peter Rother, Stuttgart, Germany

[73] Assignee: Hewlett-Packard Company, Fort Collins, Colo.

[21] Appl. No.: 09/135,807

[22] Filed: Aug. 18, 1998

[51] Int. Cl.[7] .................................................. G01R 31/08
[52] U.S. Cl. .................................. 324/526; 324/706
[58] Field of Search .......................... 324/526, 725, 324/541, 726, 142, 120

[56] References Cited

U.S. PATENT DOCUMENTS

| | | | |
|---|---|---|---|
| 4,045,734 | 8/1977 | Cox et al. | 324/142 |
| 4,378,579 | 3/1983 | Hudon | 361/45 |
| 4,785,236 | 11/1988 | Balogh et al. | 324/120 |
| 5,440,234 | 8/1995 | Kondo | 324/526 |
| 5,734,269 | 3/1998 | Sakai et al. | 324/706 |

OTHER PUBLICATIONS

Figure 1 of application #09/135,807 applied by Rother, Aug. 18, 1998.

*Primary Examiner*—Safet Metjahic
*Assistant Examiner*—Vincent Q. Nguyen

[57] ABSTRACT

According to the invention, an AC-signal is superimposed to a signal on the two lines to be monitored. A signal difference between the signals on each line is compared with the superimposed AC-signal. A short circuit between the two lines to be monitored can thus be detected when the superimposed AC-signal is not present in the signal difference. The frequency of the AC-signal is preferably selected as half of the sampling frequency of a subsequent sampling means. In a measuring bridge, the short circuit detection unit is coupled to a first and a second measuring point of the bridge.

4 Claims, 2 Drawing Sheets

SHORT CIRCUIT DETECTION IN PARTICULAR FOR A MEASURING BRIDGE

BACKGROUND OF THE INVENTION

The present invention relates to the detection of a short circuit between a first and a second electrical line and, in particular, to the detection of a short circuit between measuring lines of a measuring bridge.

Many physical parameters are generally measured by means of a transducer configured in a measuring bridge 10 as depicted in FIG. 1. The bridge 10 comprises a first arm with a series connection of a first reference impedance $Z_{R1}$ and a second reference impedance $Z_{R2}$ between a node 1 and a node 4 of the bridge 10. A second arm connected between the nodes 1 and 4 comprises a third reference impedance $Z_{R3}$ in series with a measuring impedance $Z_M$. A measuring voltage is taken as a measuring signal $S_M$ between a first measuring node 3 (between $Z_{R3}$ and $Z_M$) on a line 13 and a second measuring node 2 (between $Z_{R1}$ and $Z_{R2}$) on a line 12. A reference voltage $V_D$ is placed vertical across the bridge 10 between the nodes 1 and 4. A difference in the impedance $Z_M$ changes the signal $S_M$ which is normally amplified by an amplifier 20, e.g. a difference amplifier, and might be analog/digital converted by an A/D converter 30 or otherwise processed as required.

In many applications, it is important to know whether the bridge 10 is working properly or not. Faults in the bridge 10 may result from open wires or from short circuits. Commonly used techniques apply pull-up resistors or current sources, e.g. current sources 40 and/or 50 in FIG. 1, from plus (+$V_D$) or minus (−$V_D$) voltage supply to the nodes 2 and/or 3. This allows to detect short circuits between the nodes 2 or 3 and the voltage supply or a ground level. Open circuits can be detected accordingly as maximum or minimum voltages of the measuring signal $S_M$.

However, none of the fault detection techniques as known in the art allows a direct detection of a short circuit occurring between the nodes 2 and 3, e.g. when nodes 2 and 3 are tight together. There is no difference in the measuring signal $S_M$ between the short circuit between the nodes 2 and 3 and a zero value signal from the bridge 10. The only possibility to detect such a fault is by means of a plausibility check, i.e. by observing the variability of the measuring signal $S_M$ in combination with the expected characteristics of the signal (e.g. dynamics, repetition, etc.). However, it is clear that in particular in cases of slowly changing signals, such as pressure, force etc., which can remain for a long time at values near to zero, the plausibility check is not sufficient. Furthermore, a plausibility check has to be ruled out in case that the characteristics of the expected measuring signal $S_M$ is not known, or generally speaking, when no knowledge about the signal to be measured is available.

SUMMARY OF THE INVENTION

It is an object of the present invention to provide a possibility to determine a short circuit between two lines, and in particular between two lines from the measuring nodes of a measuring bridge. The object is solved by the independent claim. Preferred embodiments are shown by the dependent claims.

According to the invention, an AC-signal is superimposed to a signal on the two lines to be monitored. A signal difference between the signals on each line is compared with the superimposed AC-signal. A short circuit between the two lines to be monitored can thus be detected when the superimposed AC-signal is not present in the signal difference.

The frequency of the AC-signal is preferably selected as half of the sampling frequency of a subsequent sampling means, so that the AC-signal will be filtered out by a low pass filter of the sampling means.

In a measuring bridge, the short circuit detection unit is coupled to a first and a second measuring point of the bridge.

BRIEF DESCRIPTION OF THE DRAWINGS

Other objects and many of the attendant advantages of the present invention will be readily appreciated and become better understood by reference to the following detailed description when considering in connection with the accompanied drawings. Features, which are or can be built up substantially equally or similarly are referred to with the same reference sign.

DETAILED DESCRIPTION OF THE INVENTION

Figure 2:
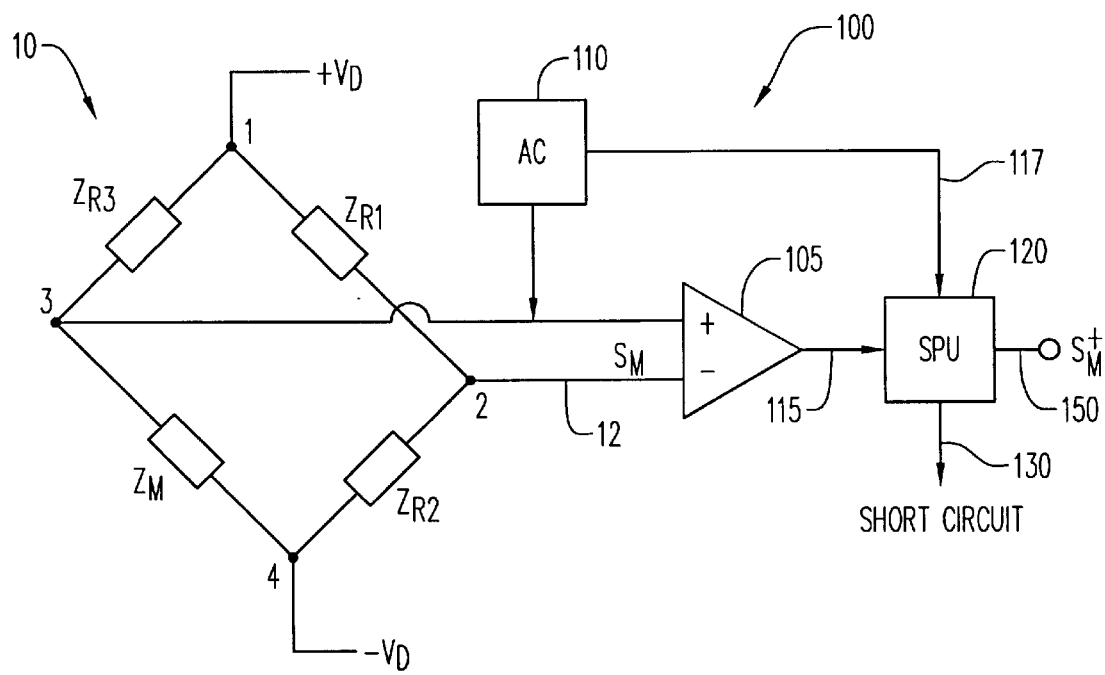
FIG. 2 shows a measuring bridge 100 according to the invention.

FIG. 2 shows a measuring bridge 100 according to the invention. The measuring signal $S_M$ is applied from the nodes 3 and 2 via the lines 13 and 12 to a difference amplifier 105. An AC-source 110 superimposes an AC-signal to the measuring signal $S_M$, preferably by coupling a line from the AC-source 110 to either one of the lines 13 or 12. The difference amplifier 105 amplifies the signal difference between the signals on the lines 13 and 12 and provides a signal, representing the difference between the signals on the lines 13 and 12, on a line 115 to a signal processing unit 120. The signal processing unit 120 further receives the AC-signal from the AC-source 110, or a signal derived therefrom, on a line 117. The signal processing unit 120 processes the signal from line 115 and the AC-signal from line 117 and determines whether the AC-signal is present in the signal on line the 115.

In case of a short circuit between lines 12 and 13, the signals on the lines 13 and 12 are equal, so that the signal difference is zero. Accordingly, there will be no AC-signal present in the signal on line 115, and the signal processing unit 120 will indicate a signal SHORT CIRCUIT on a line 130. In case that there is no short circuit between the lines 12 and 13, the signals on the lines 13 and 12 differ at least by the superimposed AC-signal, so that the AC-signal will be present in the signal on line 115. The signal processing unit 120 will detect the AC-signal in the signal on line 115 and the signal SHORT CIRCUIT will be disabled.

In case that the measuring signal $S_M$ on the lines 13 and 12 is zero, i.e. the signals on the lines 13 and 12 were equal if no AC-signal were superimposed, the signals of lines 13 and 12 at the input of the difference amplifier 105 differ precisely by the superimposed AC-signal, so that the AC-signal, amplified by the difference amplifier 105, represents the signal on the line 115. Thus, the measuring bridge 100 can detect a short circuit between the lines 13 and 12 even when the measuring signal $S_M$ is zero.

The signal processing unit 120 preferably comprises a synchronous detection unit and/or a differentiator as well-known in the art. The signal processing unit 120 may also provide a low pass filtering of the signal from line 115 to achieve a better signal to noise performance e.g. for low level test signals. The signal processing unit 120 may provide any signal processing means as known in the art to detect the presence of the AC-signal in the signal on line 115, such as signal correlation means, signal comparators, or the like.

In a preferred embodiment, the signal processing unit 120 determines the correlation between the signal on line 115 and the AC-signal provided on line 117. In case the correlation between the signals on lines 115 and 117 falls below a predefined threshold of a minimum correlation, the signal processing unit 120 will indicate the signal SHORT CIRCUIT on the line 130 or otherwise signal a short circuit between the lines 12 and 13.

The signal-processing unit 120 preferably provides on a line 150 the measuring $S_M$ superimposed with the AC-signal and/or a signal wherein the AC-signal has already been removed.

Figure 1:
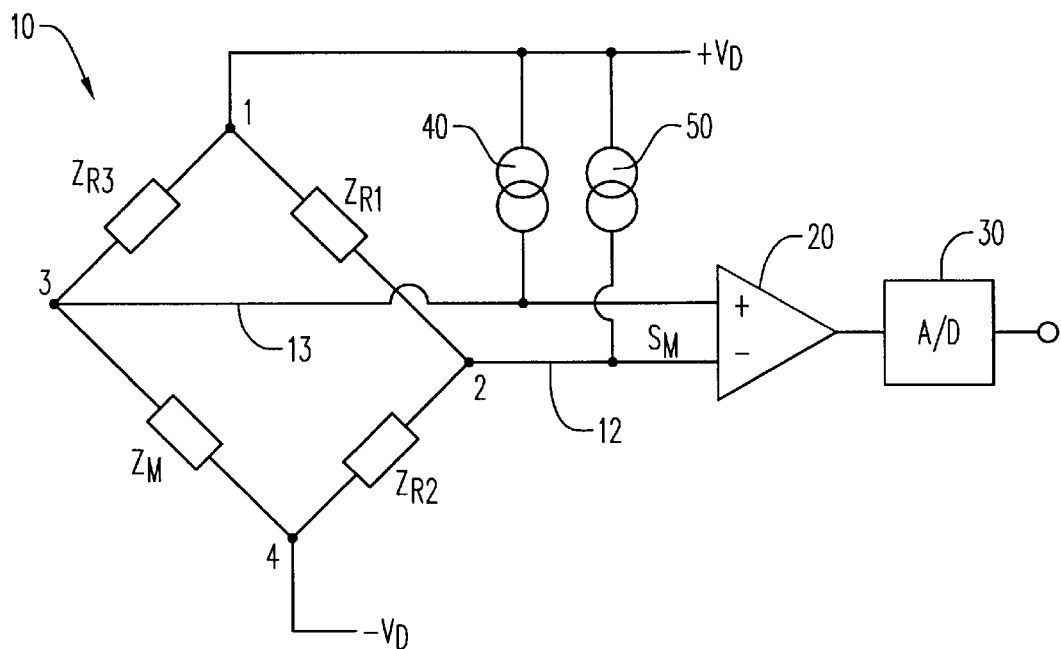
FIG. 1 shows a measuring bridge 10 as known in the art.

In a preferred embodiment, the A/D converter 30 (cf. FIG. 1) is coupled to the line 150 receiving the measuring signal $S_M$ superimposed with the AC-signal. The A/D converter 30 provides a sampling of the received signal with a sampling frequency $F_S$. In order to remove the AC-signal from the received signal, the frequency of the AC-signal is selected to be (the Nyquist frequency) $F_2/2$. Thus, a digital low pass filter of the A/D converter 30, which normally provides a pole at the frequency $F_2/2$, will filter out the superimposed AC-signal, so that the output of the A/D converter 30 will provide the digitized (and amplified) measuring signal $S_M$.

The AC-source 110 can be any AC source as known in the art and might couple to only one line of the lines 12 and 13 or to both. In a preferred embodiment, the AC-source 110 is provided by a bipolar pulsed current source or by two unipolar pulsed current sources. In the latter case, each of the current sources couples to one of the lines 12 or 13.

Figure 3:
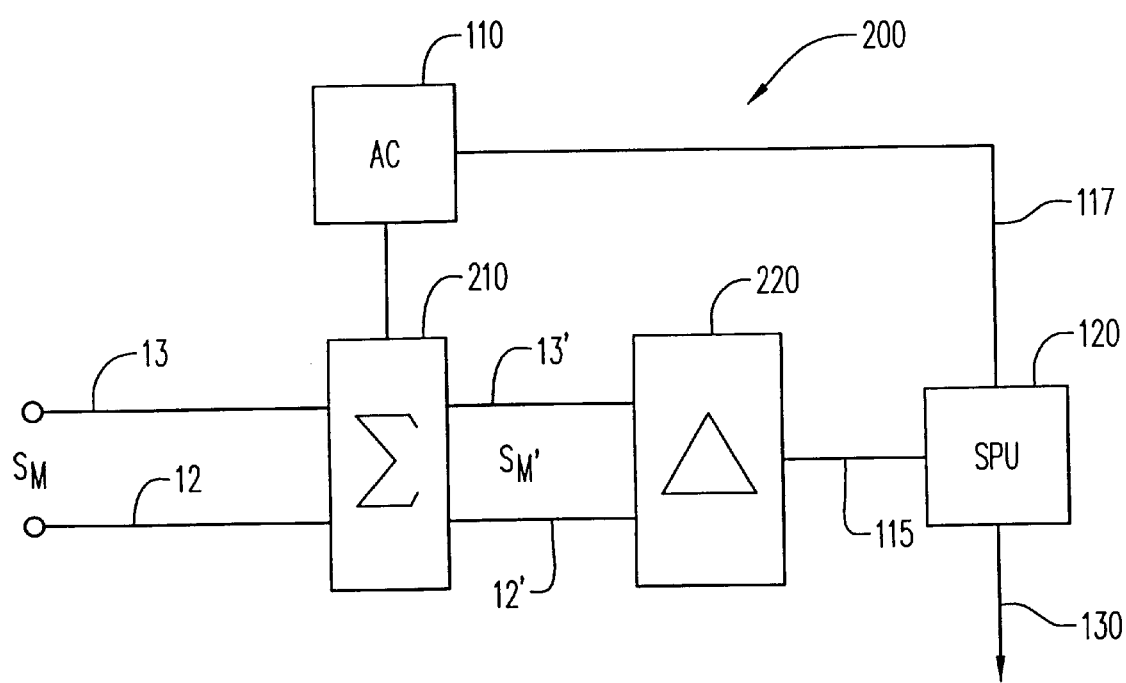
FIG. 3 explains the general principle of the invention.

It is clear that the short circuit detection as depicted in FIG. 2 is not limited to applications with measuring bridges. FIG. 3 shows the general principle of the invention for a short circuit detector 200 for detecting a short circuit between the lines 12 and 13. A signal superimposing unit 210 receives the lines 12 and 13 and the AC signal from the AC-generator 110. The signal superimposing unit 210 superimposes the AC-signal to the signal $S_M$ of lines 12 and 13 to a resulting signal $S_M'$ on lines 12' and 13'. This can be accomplished by coupling the AC-signal either to line 12 or 13, or between the lines 12 and 13. The superimposing has to be provided in a way that the difference between signals on lines 12 and 13 at least substantially represents or comprises the AC-signal. A signal difference determining unit 220 is coupled to the lines 12' and 13' and determines a signal difference representing a difference between the signals on the lines 12' and 13'. The signal difference is provided via the line 115 to the signal processing unit 120, which determines whether the AC-signal is present in the signal difference.

What is claimed is:

1. A system for detecting a short circuit between a first line and a second line, the system comprising:

a signal superimposing unit for superimposing an AC-signal on at least one of the first line and the second line, a signal difference determining unit, coupled to the first and the second line, for determining a signal difference between signals on the first line and signals on the second line, and a signal processing unit, receiving a signal representing the signal difference and a signal representing the AC-signal, for determining whether the AC-signal is present in the signal representing the signal difference, wherein an absence of the AC-signal in the signal representing the signal difference indicates a short circuit between the first line and the second line.

2. The system of claim 1, further comprising sampling means coupled to the signal processing unit for sampling, with a sampling frequency $F_S$, the signal representing the signal difference, wherein the frequency of the AC-signal is $F_S/2$.

3. The system according to claim 1, further comprising a measuring bridge having a first measuring point coupled to the first line and a second measuring point coupled to the second line.

4. The system according to claim 2, further comprising a measuring bridge having a first measuring point coupled to the first line and a second measuring point coupled to the second line.

* * * * *